United States Patent
Ko et al.

(10) Patent No.: US 10,283,698 B2
(45) Date of Patent: May 7, 2019

(54) SEMICONDUCTOR DEVICES AND METHODS OF FABRICATING THE SAME

(71) Applicants: Seung Pil Ko, Hwaseong-si (KR); Kiseok Suh, Hwaseong-si (KR); Kilho Lee, Busan (KR); Daeeun Jeong, Yongin-si (KR)

(72) Inventors: Seung Pil Ko, Hwaseong-si (KR); Kiseok Suh, Hwaseong-si (KR); Kilho Lee, Busan (KR); Daeeun Jeong, Yongin-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 15/666,903

(22) Filed: Aug. 2, 2017

(65) Prior Publication Data
US 2018/0198059 A1    Jul. 12, 2018

(30) Foreign Application Priority Data

Jan. 10, 2017 (KR) .................. 10-2017-0003664

(51) Int. Cl.

| | |
|---|---|
| *H01L 43/02* | (2006.01) |
| *H01L 23/522* | (2006.01) |
| *H01L 23/528* | (2006.01) |
| *H01L 43/08* | (2006.01) |
| *H01L 27/22* | (2006.01) |
| *H01L 21/768* | (2006.01) |
| *H01L 43/12* | (2006.01) |

(Continued)

(52) U.S. Cl.
CPC ........ *H01L 43/02* (2013.01); *H01L 21/76804* (2013.01); *H01L 21/76843* (2013.01); *H01L 21/76877* (2013.01); *H01L 23/485* (2013.01); *H01L 23/5226* (2013.01); *H01L 23/5283* (2013.01); *H01L 27/222* (2013.01); *H01L 43/08* (2013.01); *H01L 43/12* (2013.01); *H01L 23/53238* (2013.01); *H01L 23/53266* (2013.01)

(58) Field of Classification Search
CPC ............... H01L 43/02; H01L 21/76804; H01L 21/76843; H01L 21/76877; H01L 23/5226; H01L 23/5283; H01L 27/222; H01L 43/08; H01L 43/12; H01L 23/53238; H01L 23/53266

See application file for complete search history.

(56) References Cited

U.S. PATENT DOCUMENTS

| | | |
|---|---|---|
| 8,227,351 B2 | 7/2012 | Li |
| 8,492,881 B2 | 7/2013 | Kuroiwa et al. |

(Continued)

*Primary Examiner* — Fernando L Toledo
*Assistant Examiner* — Neil R Prasad
(74) *Attorney, Agent, or Firm* — Harness, Dickey & Pierce, P.L.C.

(57) ABSTRACT

A device, which may include a semiconductor device, may include a contact plug, a first barrier metal covering a bottom surface of the contact plug and a lower sidewall of the contact plug, such that the first barrier metal exposes an upper sidewall of the contact plug, and an insulation pattern covering the upper sidewall of the contact plug such that the insulation pattern isolates the first barrier metal from exposure. A magnetic tunnel junction pattern may cover a top surface of the contact plug. Each element of the contact plug, the first barrier metal, and the insulation pattern may be in a contact hole of a first interlayer dielectric layer.

18 Claims, 18 Drawing Sheets

(51) Int. Cl.
*H01L 23/485* (2006.01)
*H01L 23/532* (2006.01)

(56) References Cited

U.S. PATENT DOCUMENTS

| | | | |
|---|---|---|---|
| 9,231,192 B2 | 1/2016 | Ikeno et al. | |
| 9,306,156 B2 | 4/2016 | Noh et al. | |
| 9,406,875 B2 | 8/2016 | Li et al. | |
| 9,509,173 B2 | 11/2016 | Kim et al. | |
| 9,590,173 B2 | 3/2017 | Iwayama | |
| 2015/0032960 A1* | 1/2015 | Dong | G06F 12/0842 |
| | | | 711/118 |
| 2015/0255706 A1* | 9/2015 | Iwayama | H01L 43/08 |
| | | | 257/421 |
| 2016/0072048 A1* | 3/2016 | Ito | H01L 43/08 |
| | | | 257/421 |
| 2017/0053965 A1* | 2/2017 | Baek | H01L 27/228 |
| 2017/0062712 A1* | 3/2017 | Choi | H01L 45/1233 |
| 2017/0192678 A1* | 7/2017 | Kim | G06F 3/0604 |

* cited by examiner

SEMICONDUCTOR DEVICES AND METHODS OF FABRICATING THE SAME

CROSS-REFERENCE TO RELATED APPLICATIONS

This U.S. nonprovisional patent application claims priority under 35 U.S.C. § 119 of Korean Patent Application No. 10-2017-0003664 filed on Jan. 10, 2017, the entire contents of which are hereby incorporated by reference.

BACKGROUND

The present inventive concepts relate to semiconductor devices and methods of fabricating the same.

As electronic devices trend toward high speed and low power consumption, semiconductor memory devices incorporated therein may be configured to be associated with high-speed read/write operations and low operating voltages. Magnetic memory devices have been considered as memory devices to enable such configurations. As magnetic memory devices can operate at high speed and have non-volatile characteristics, magnetic memory devices have attracted considerable attention as the next generation of memory devices.

A magnetic memory device may include a magnetic tunnel junction (MTJ) pattern. Two magnetic structures and an insulation layer interposed therebetween may form the magnetic tunnel junction pattern, whose resistance ("electrical resistance") may be changed depending on magnetization directions of the two magnetic structures. For example, the magnetic tunnel junction pattern may have high resistance when the two magnetic structures have anti-parallel magnetization directions and low resistance when the two magnetic structures have parallel magnetization directions. The magnetic memory device may write/read data using the above-mentioned difference in resistance of the magnetic tunnel junction pattern.

SUMMARY

Some example embodiments of the present inventive concepts provide a method of fabricating a semiconductor device capable of mitigating and/or preventing an electrical short caused by re-deposition of a conductive material when a magnetic tunnel junction pattern is formed.

Some example embodiments of the present inventive concepts provide a semiconductor device capable of being driven by low power.

According to some example embodiments of the present inventive concepts, a device may include a first interlayer dielectric layer on a semiconductor substrate, the first interlayer dielectric layer including a contact hole, a contact plug in the contact hole, a first barrier metal in the contact hole, the first barrier metal covering a bottom surface of the contact plug and a lower sidewall of the contact plug, the first barrier metal exposing an upper sidewall of the contact plug, and a magnetic tunnel junction pattern covering a top surface of the contact plug.

According to some example embodiments of the present inventive concepts, a method of fabricating a semiconductor device may include forming an interlayer dielectric layer on a semiconductor substrate, the interlayer dielectric layer including a contact hole, forming a first barrier metal that conformally covers a sidewall of the contact hole, forming a first contact plug in the contact hole, replacing an upper portion of the first barrier metal with an insulation pattern, and forming a magnetic tunnel junction pattern that covers a top surface of the first contact plug, the magnetic tunnel junction pattern further exposes the insulation pattern.

According to some example embodiments of the present inventive concepts, a device may include a first interlayer dielectric layer including a contact hole, a contact plug in the contact hole, a first barrier metal in the contact hole, the first barrier metal covering a bottom surface of the contact plug and a lower sidewall of the contact plug, the first barrier metal exposing an upper sidewall of the contact plug, and an insulation pattern in the contact hole, the insulation pattern covering the upper sidewall of the contact plug, the insulation pattern isolating the first barrier metal from exposure.

According to some example embodiments of the present inventive concepts, a device may include a contact plug, a first barrier metal covering a bottom surface of the contact plug and a lower sidewall of the contact plug, the first barrier metal exposing an upper sidewall of the contact plug, and an insulation pattern covering the upper sidewall of the contact plug.

DETAILED DESCRIPTION

It will be hereinafter described a semiconductor device and a method of fabricating the same according to some example embodiments of the present inventive concepts.

FIG. 1, FIG. 2, FIG. 3, FIG. 4, FIG. 5, FIG. 6, FIG. 7, FIG. 8, and FIG. 9 are cross-sectional views illustrating a method of fabricating a semiconductor device according to some example embodiments of the present inventive concepts.

Figure 1:
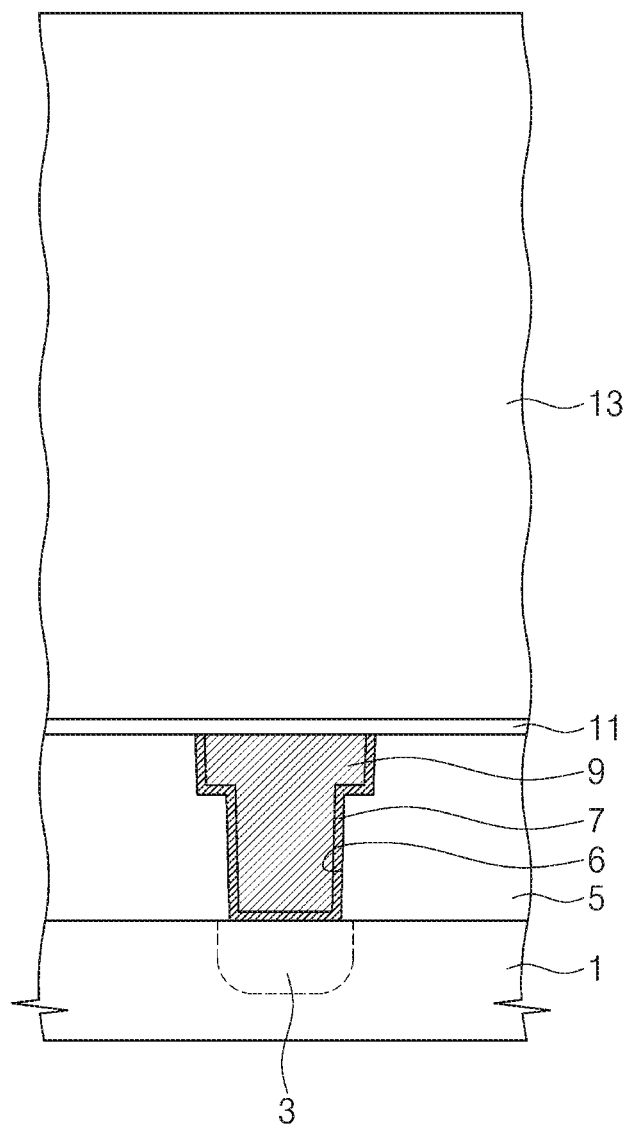
FIG. 1, FIG. 2, FIG. 3, FIG. 4, FIG. 5, FIG. 6, FIG. 7, FIG. 8, and FIG. 9 are cross-sectional views illustrating a method of fabricating a semiconductor device according to some example embodiments of the present inventive concepts.

Referring to FIG. 1, an ion implantation process or the like may be performed to form an impurity region 3 in a semiconductor substrate 1. As not shown in figures, the impurity region 3 may correspond to a source/drain region of a transistor whose gate electrode is configured to be used as a word line. A first interlayer dielectric layer 5 may be formed on the semiconductor substrate 1. The first interlayer dielectric layer 5 may be patterned to form a first contact hole 6 exposing the impurity region 3, a first barrier metal 7 may be conformally formed such that the first barrier metal conformally covers an inner sidewall (also referred to interchangeably herein as simply a "sidewall") of the first contact hole 6, a conductive layer may be formed such that the conductive layer fills the first contact hole 6, and a planarization process such as chemical-mechanical planarization (CMP) or etch-back may be performed to form a first contact plug 9 filling or substantially filling the first contact hole 6 in which the first barrier metal 7 is formed (e.g., filling within manufacturing tolerances and/or material tolerances). The first contact plug 9 may include metal such as copper or tungsten. The first barrier metal 7 may be a metal nitride layer such as a titanium nitride layer or a tungsten nitride layer. An etch stop layer 11 and a second interlayer dielectric layer 13 may be sequentially formed on the first interlayer dielectric layer 5. The etch stop layer 11 may be, for example, a silicon nitride layer. The first and second interlayer dielectric layers 5 and 13 may be formed of silicon oxide, tetraethyl orthosilicate (TEOS), or plasma enhanced tetraethyl orthosilicate (PE-TEOS), respectively.

Figure 2:
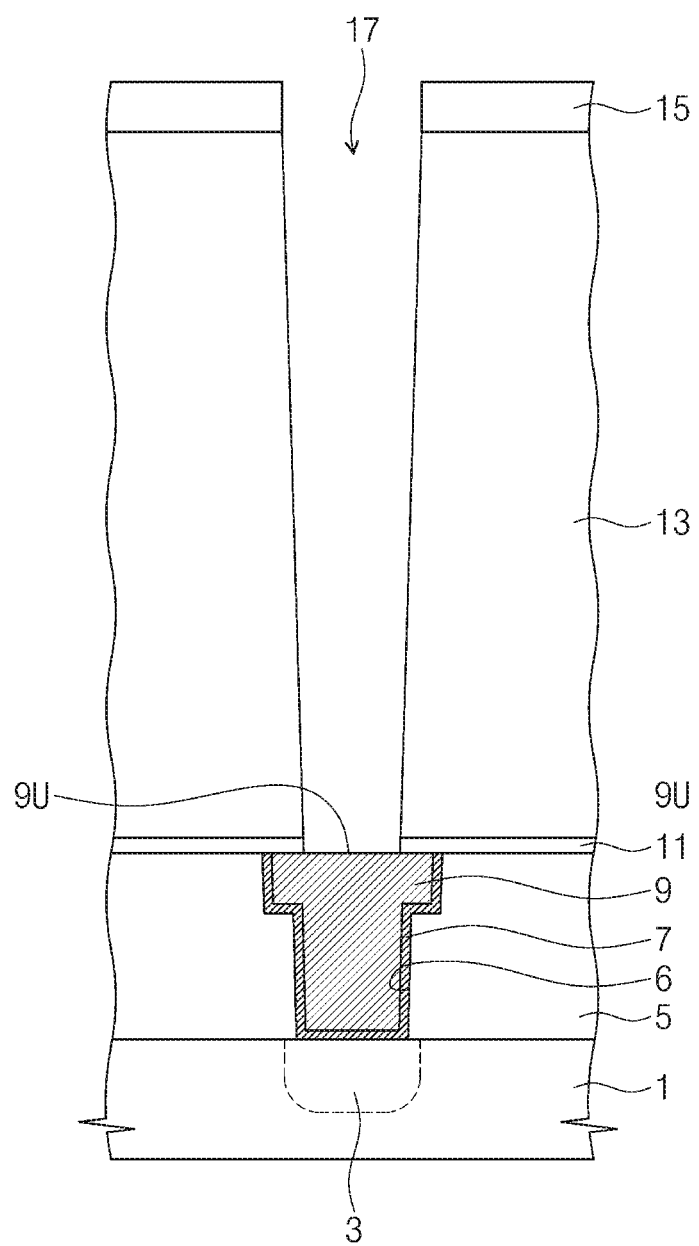

Referring to FIG. 2, a first mask pattern 15 may be formed on the second interlayer dielectric layer 13. The first mask pattern 15 may be used as an etch mask to sequentially etch the second interlayer dielectric layer 13 and the etch stop layer 11, and thereby a second contact hole 17 may be formed to at least partially expose a top surface 9U of the first contact plug 9.

Figure 3:
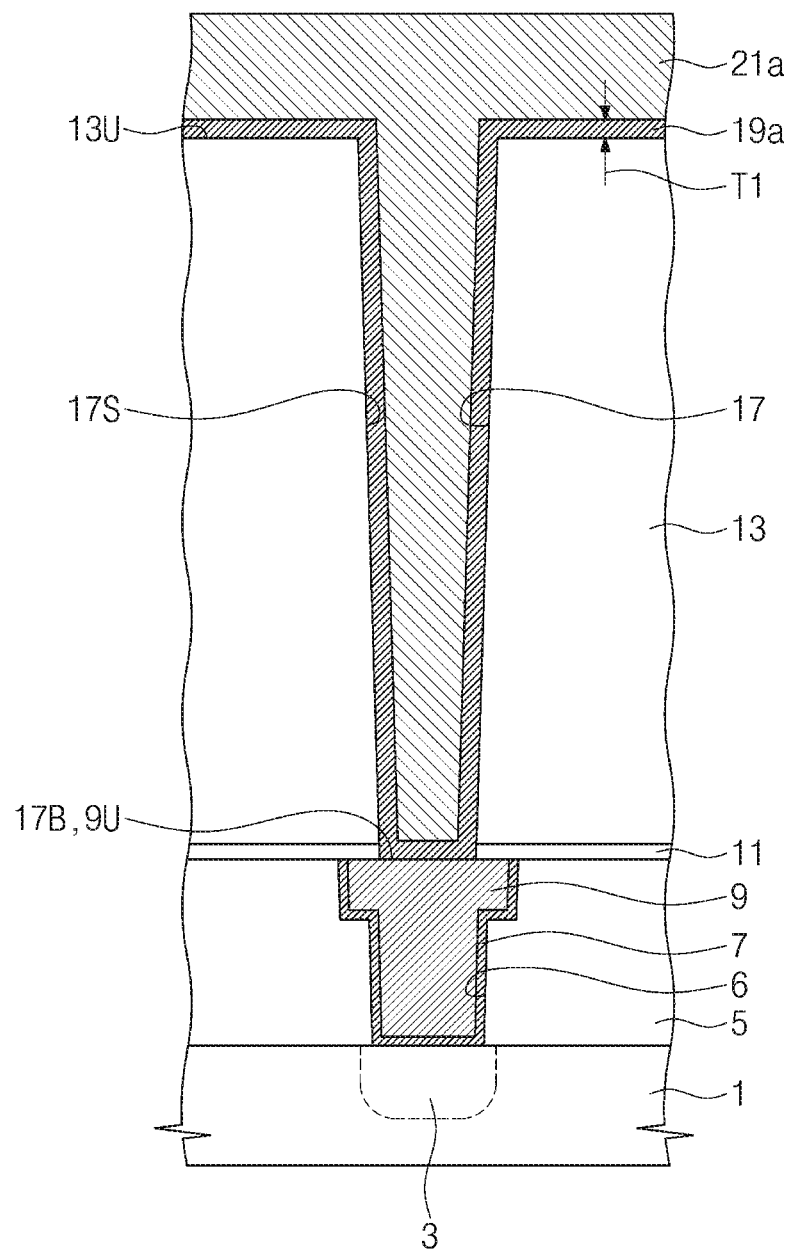

Referring to FIG. 3, the first mask pattern 15 may be removed to expose a top surface 13U of the second interlayer dielectric layer 13. A second barrier metal layer 19a may be conformally stacked on an entire surface of the semiconductor substrate 1 to cover inner surfaces 17S (e.g., sidewalls) and floor surfaces 17B of the second contact hole 17. The second barrier metal layer 19a may have a first thickness T1. It will be understood that, as shown in FIGS. 2-3, the floor surfaces 17B of the second contact hole 17 may correspond to and/or may be the same as the portion of the top surface 9U of the first contact plug that is exposed by the second interlayer dielectric layer 13. The second contact hole 17 may be filled with a second conductive layer 21a stacked on an entire surface of the second barrier metal layer 19a.

Figure 4:
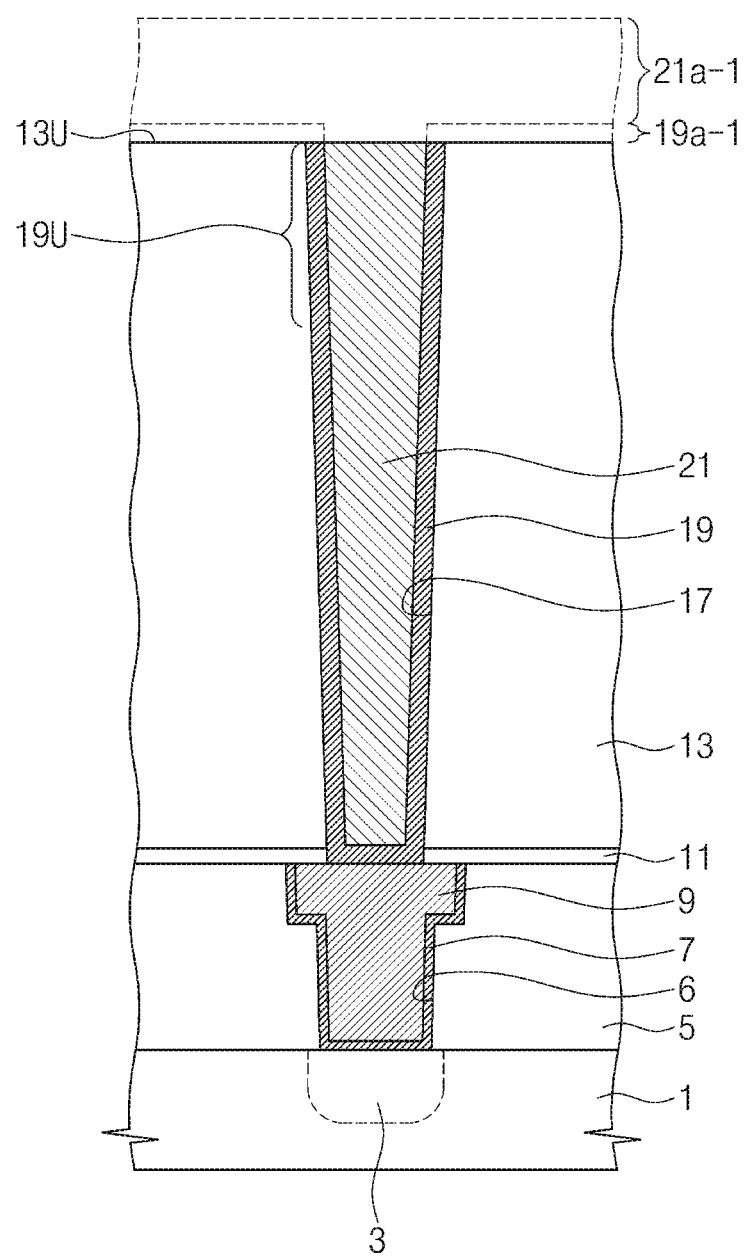

Referring to FIG. 4, a planarization process such as CMP or etch-back may be performed to expose the top surface 13U of the second interlayer dielectric layer 13, based on removal of an upper portion 19a-1 of the second barrier metal layer 19a and an upper portion 21a-1 of the second conductive layer 21a, and concurrently to form a second barrier metal 19 and a second contact plug 21 in the second contact hole 17. The second barrier metal 19 may be formed of ("may at least partially comprise") a metal nitride layer such as a titanium nitride layer or a tungsten nitride layer. The second contact plug 21 may be formed of a different material (e.g., tungsten) from that of the second barrier metal 19. The second barrier metal 19 may act ("may be configured") to mitigate and/or prevent the second contact plug 21 from reacting with the first contact plug 9, e.g., if and/or when the first contact plug 9 is formed of copper and the second contact plug 21 is formed of tungsten. For example, if and/or when the first contact plug 9 is formed of copper and the second contact plug 21 is formed of tungsten, and the second barrier metal 19 is not present in between the first contact plug 9 and the second contact plug 21 in the second contact hole 17, the tungsten may diffuse toward the copper to induce volume expansion caused by reaction of the two metals.

Figure 5:
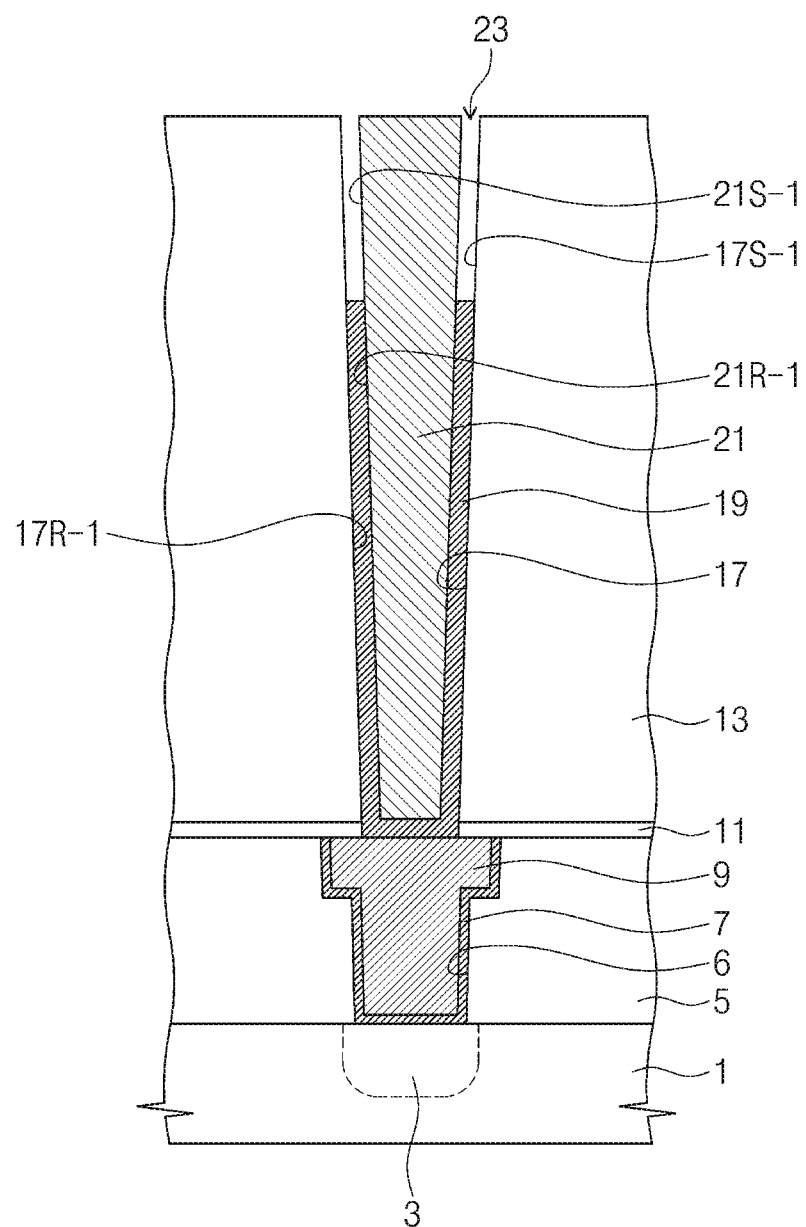

Referring to FIG. 5, a selective removal may be performed on an upper portion 19U of the second barrier metal 19 to form a groove 23 having a ring shape exposing an upper sidewall 17S-1 of the second contact hole 17 and an upper sidewall 21S-1 of the second contact plug 21. Thus, the remaining second barrier metal 19 covers a lower sidewall 17R-1 of the second contact hole 17 and a lower sidewall 21R-1 of the second contact plug 21. The selective removal of the upper portion 19U of the second barrier metal 19 may be achieved based on a wet etching process using an etchant that includes, for example, sulfuric acid, peroxide, and/or inorganic ammonium.

Figure 6:
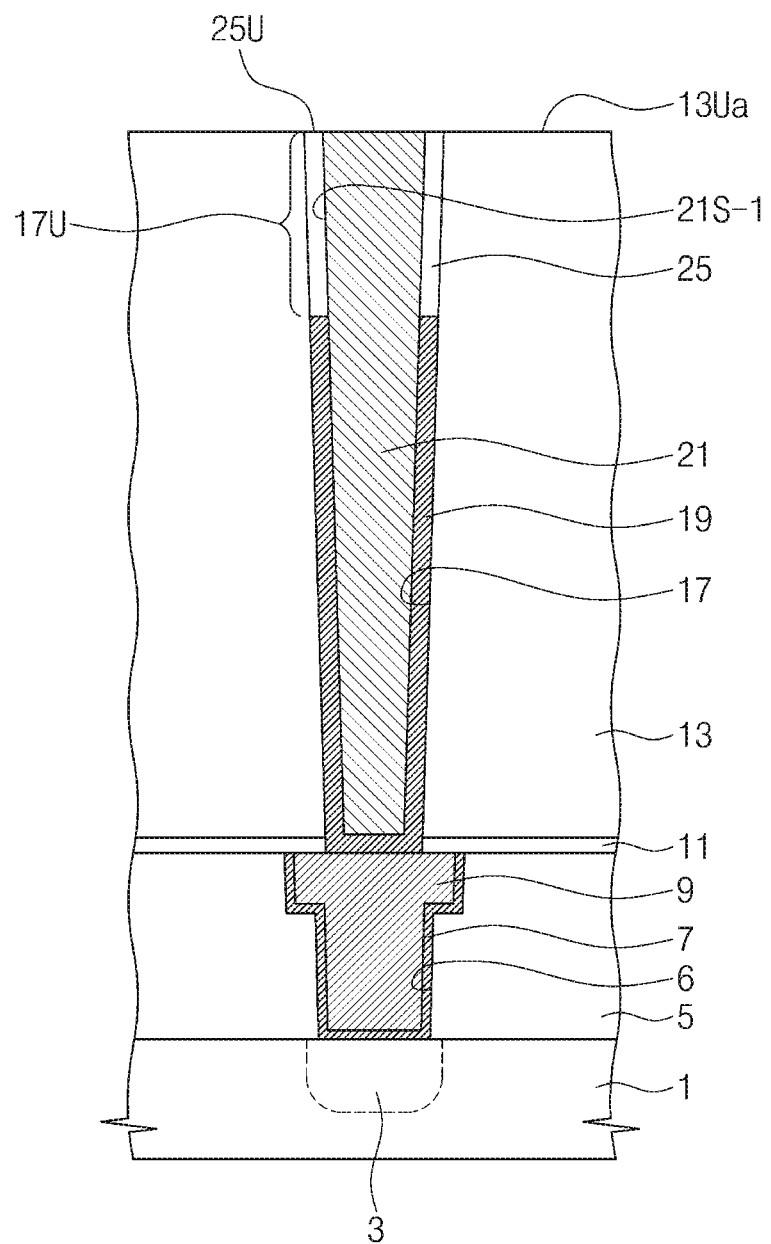

Referring to FIG. 6, an entirety of the groove 23 may be filled or substantially filled (e.g., filled within manufacturing tolerances and/or material tolerances) with an insulation layer formed on the entire surface of the semiconductor substrate 1. Subsequently to the formation of the insulation layer, a planarization process such CMP or etch-back may be performed to remove the insulation layer on the top surface 13Ua of the second interlayer dielectric layer 13 and to leave an insulation pattern 25 in the groove 23, such that a top surface 25U of the insulation pattern 25 is coplanar or substantially coplanar (e.g., coplanar within manufacturing tolerances and/or material tolerances) with the top surface 13Ua of the second interlayer dielectric layer 13. The insulation pattern 25 may be formed of, for example, a silicon oxide layer, a silicon nitride layer, or a silicon oxynitride layer. In an upper portion 17U of the second contact hole 17, the insulation pattern 25 may surround the exposed upper sidewall 21S-1 of the second contact plug 21 and may be exposed on its top surface (e.g., the top surface 25U of the insulation pattern 25).

Figure 7:
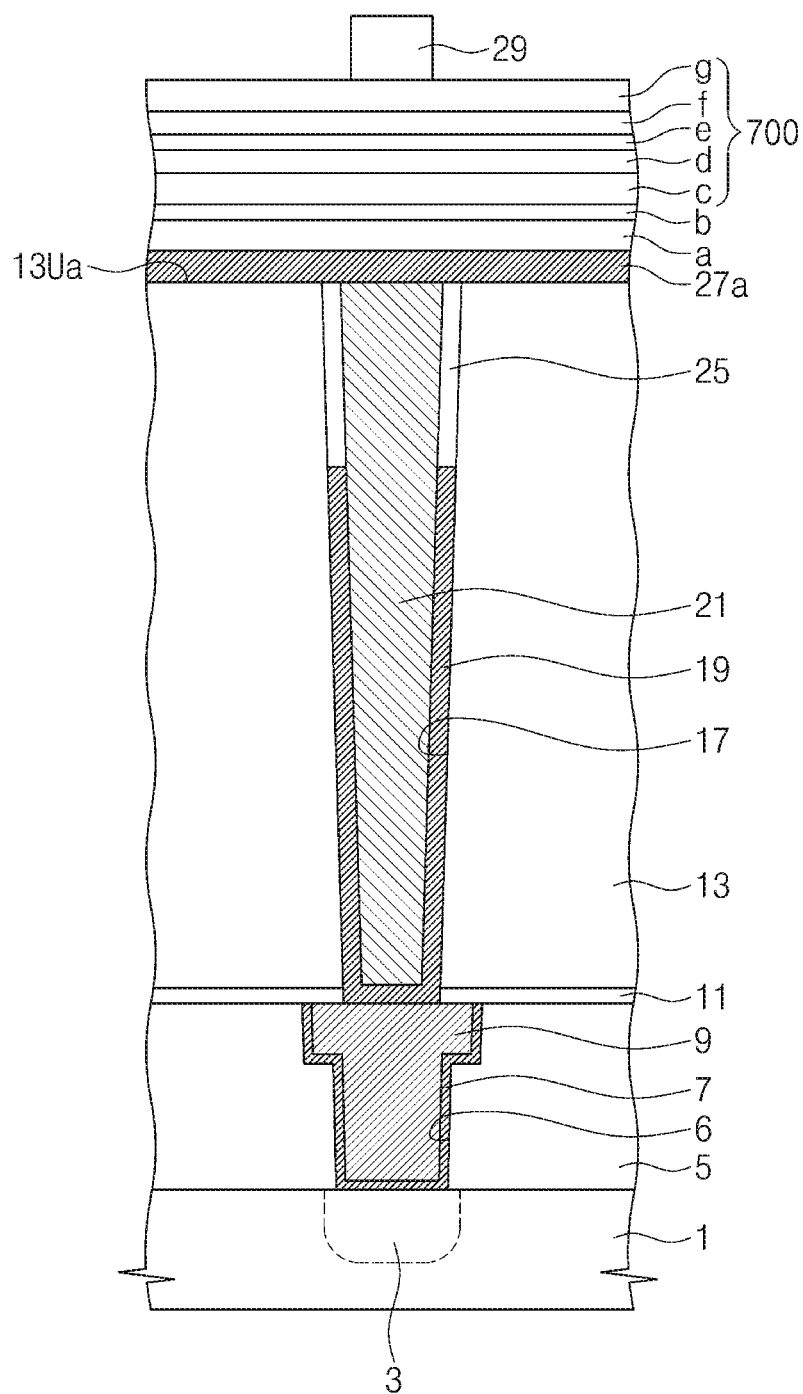
Figure 8:
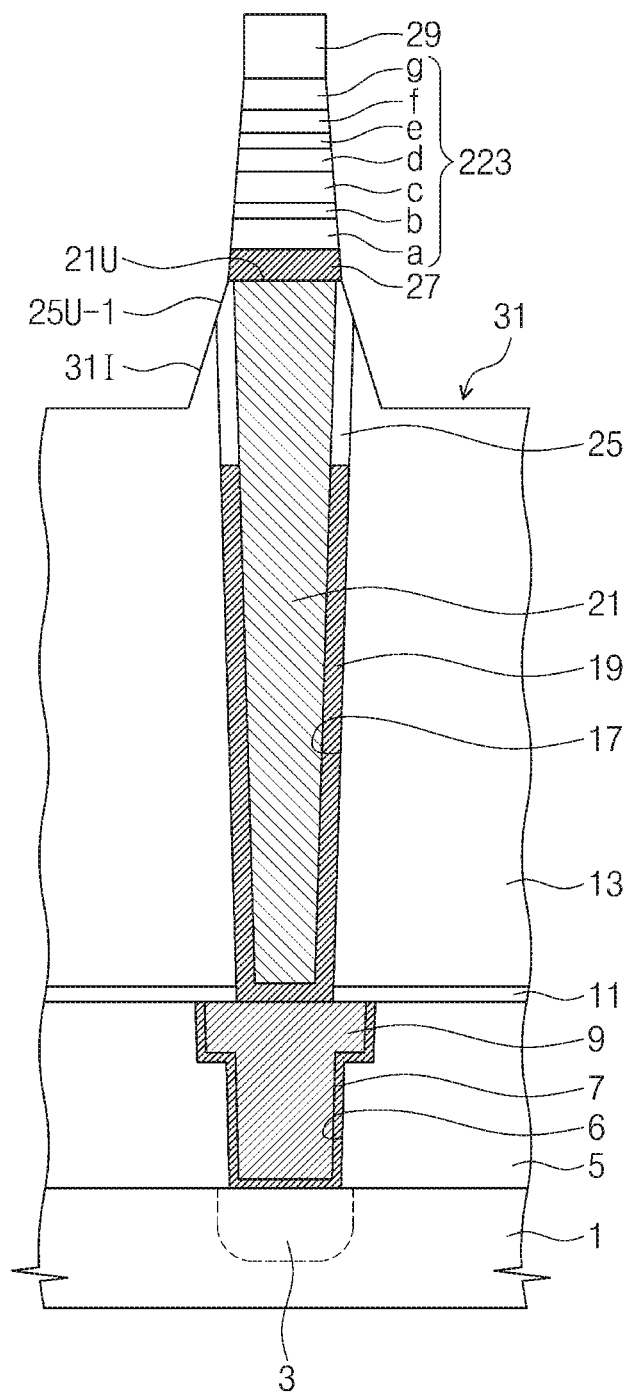

Referring to FIG. 7, a conductive pad layer 27a may be formed on the top surface 13Ua of the second interlayer dielectric layer 13. The conductive pad layer 27a may be referred to interchangeably herein as an "amorphous conductive pad." The conductive pad layer 27a may be, for example, a titanium nitride layer having an amorphous crystal structure. In some example embodiments, the conductive pad layer 27a may have a crystal structure the same or substantially the same (e.g., the same within manufacturing tolerances and/or material tolerances) as that essentially included in a first magnetic layer a which will be discussed below. The conductive pad layer 27a may be provided thereon with a first magnetic layer a, a tunnel barrier layer b, a second magnetic layer c, and a capping layer d that are sequentially stacked, and then an annealing process may be performed to crystallize the first magnetic layer a and the second magnetic layer c. When the annealing process is performed, as the conductive pad layer 27a in contact with the first magnetic layer a is an amorphous crystal layer or has the same or substantially the same crystal structure as the essential structure of the first magnetic layer a, the conductive pad layer 27a may have an effect on crystallization of the first magnetic layer a. The annealing process may be performed after deposition of the layers a to g all constituting a magnetic tunnel junction pattern 223, as shown in FIG. 8. When the annealing process is performed under a condition that the first magnetic layer a is in direct contact with the second contact plug 21 without the conductive pad layer 27a therebetween, the first magnetic layer a may be resistant to crystallization due to its crystallization tendency affected by a crystal structure of the second contact plug 21. The capping layer d may mitigate and/or prevent oxidation of the first and second magnetic layers a and c when the annealing process is performed. In addition, the capping layer d may act to allow the second magnetic layer c to maintain its perpendicular magnetization characteristics. Thereafter, a first pinned layer e, an exchange coupling layer f, and a second pinned layer g may be sequentially stacked on the capping layer d, and then a magnetic field process may be performed. The second magnetic layer c, the capping layer d, the first pinned layer e, the exchange coupling layer f, and the second pinned layer g may be collectively hereinafter called a reference layer 700.

Through the above-mentioned processes, the first magnetic layer a, the tunnel barrier layer b, and the reference layer 700 may be formed. The stacking sequence of the first magnetic layer a, the tunnel barrier layer b, and the reference layer 700 may be changed around the tunnel barrier layer b. For example, the first magnetic layer a may be disposed below the tunnel barrier layer b, and the reference layer 700 may be disposed above the tunnel barrier layer b. In some example embodiments, the first magnetic layer a may be disposed above the tunnel barrier layer b, and the reference layer 700 may be disposed below the tunnel barrier layer b. The first magnetic layer a may also be called a free layer. The reference layer 700 may also be called a pinned layer. The first and second magnetic layers a and c may include, for example, cobalt (Co) atoms, iron (Fe) atoms, and/or nickel (Ni) atoms. The tunnel barrier layer b may include one or more of magnesium (Mg) oxide, titanium (Ti) oxide, aluminum (Al) oxide, magnesium-zinc (MgZn) oxide, magnesium-boron (MgB) oxide, titanium (Ti) nitride, vanadium (V) nitride, and titanium-vanadium (TiV) nitride. The capping layer d may include one or more of tantalum (Ta), tantalum oxide (TaOx), titanium (Ti), titanium oxide (TiOx), ruthenium (Ru), ruthenium oxide (RuOx), lead (Pb), platinum (Pt), and gold (Au). The pinned layers e and g may be formed by alternately stacking nonmagnetic layers and ferromagnetic layers. The ferromagnetic layers may include one or more of iron (Fe), cobalt (Co), and nickel (Ni), and the nonmagnetic layers may include one or more of chromium (Cr), platinum (Pt), palladium (Pd), iridium (Jr), ruthenium (Ru), rhodium (Rh), osmium (Os), rhenium (Re), gold (Au), and copper (Cu). The exchange coupling layer f may include one or more of magnesium (Mg), aluminum (Al), titanium (Ti), chromium (Cr), ruthenium (Ru), copper (Cu), zinc (Zn), tantalum (Ta), gold (Au), silver (Ag), palladium (Pd), rhodium (Rh), iridium (Jr), molybdenum (Mo), vanadium (V), tungsten (W), niobium (Nb), zirconium (Zr), yttrium (Y), and hafnium (Hf).

A second mask pattern 29 may be formed on the second pinned layer g. The second mask pattern 29 may include, for example, a silicon nitride layer, a photoresist pattern, or a metal layer.

Referring to FIG. 8, the second mask pattern 29 may be used as an etch mask to sequentially pattern the layers a to g and the conductive pad layer 27a, and thereby a conductive pad 27 and a magnetic tunnel junction pattern 223 may be formed and concurrently a top surface 25U-1 of the insulation pattern 25 may be exposed. The conductive pad 27 may be formed to completely cover a top surface 21U of the second contact plug 21. The top surface 25U-1 of the insulation pattern 25 may be exposed on opposite sides of the conductive pad 27. An etching process may generate variation in etching distribution on the entirety of a wafer. FIG. 8 shows that the second interlayer dielectric layer 13 is over-etched to form recessed regions 31 at its upper portion in order to mitigate and/or prevent a bridge or short between the conductive pads 27 on the entirety of the semiconductor substrate 1. The recessed region 31 may have an inclined sidewall 31I, and the top surface 25U-1 of the insulation pattern 25 may be exposed on an end of the recessed region 31. Restated, the top surface 25U-1 of the insulation pattern 25 may be exposed on an edge of a sidewall 31I of the recessed region 31. When, instead of the insulation pattern 25, conductive layers such as the second contact plug 21 and/or the second barrier metal 19 are exposed in an etching process for forming the magnetic tunnel junction pattern 223 and the conductive pad 27, the etching process may also partially etch the second contact plug 21 and/or the second barrier metal 19 such that a constituent of the second contact plug 21 and/or the second barrier metal 19 may be re-deposited (or attached) on at least one sidewall of the magnetic tunnel junction pattern 223, thereby generating an electrical short between the layers a to g. According to the present inventive concepts, the insulation pattern 25 isolates the second barrier metal 19 from exposure, such that the insulation pattern 25 is exposed instead. Since the insulation pattern 25 is exposed, a probability of electrical shorting may be mitigated and/or prevented between the layers a to g even if an insulating constituent of the insulation pattern 25 is attached onto the sidewall of the magnetic tunnel junction pattern 223. As a result, the operating performance of a semiconductor device including the layers a to g and the insulation pattern 25 may be improved based on mitigating and/or preventing the aforementioned electrical shorting.

Figure 9:
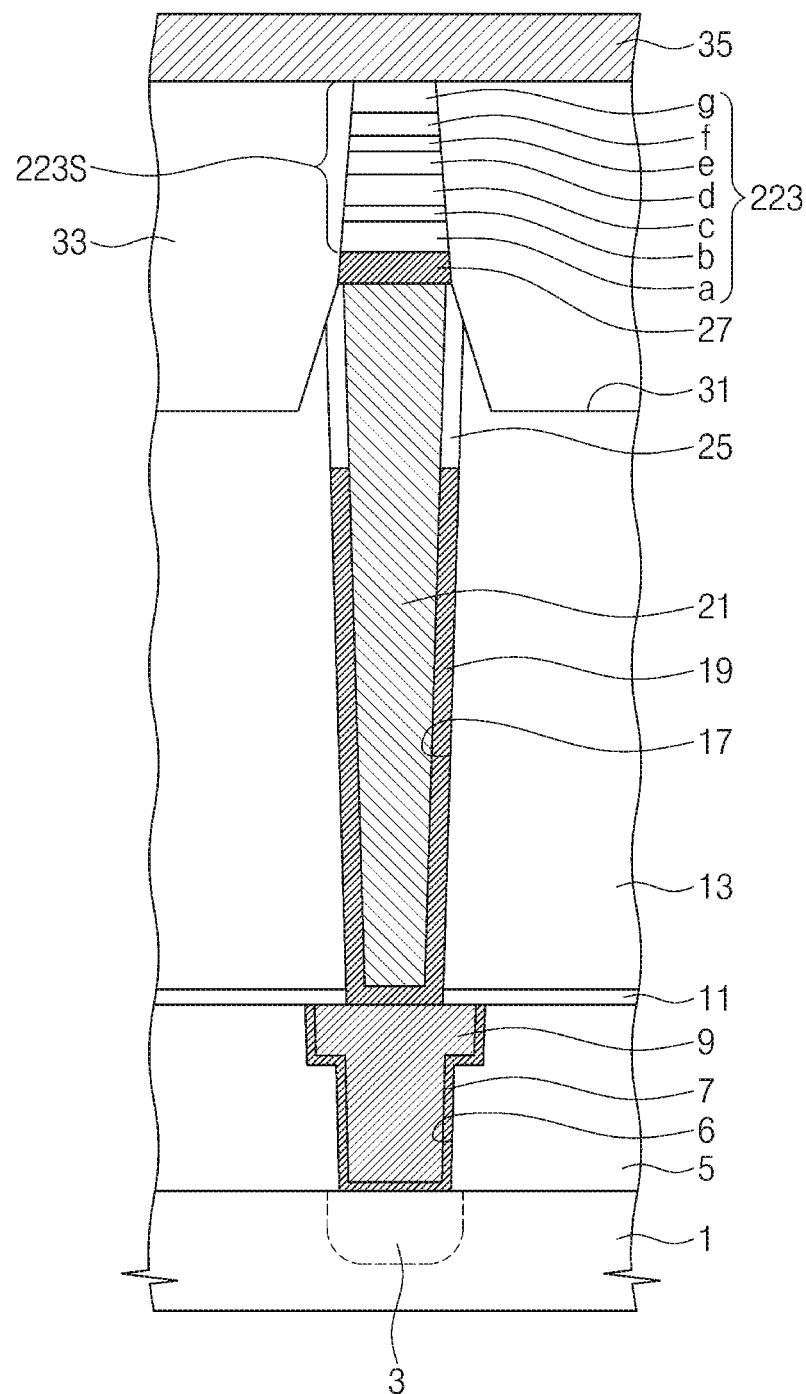

Referring to FIG. 9, the second mask pattern 29 may be removed to expose the second pinned layer g. The semiconductor substrate 1 may be provided on its entire surface with a third interlayer dielectric layer 33 filling the recessed regions 31 and covering the sidewalls 223S (where a "sidewall" is also referred to interchangeably herein as a "side surface") of the magnetic tunnel junction pattern 223. The third interlayer dielectric layer 33 may undergo a CMP or etch-back process to expose of the second pinned layer g. The third interlayer dielectric layer 33 may be provided thereon with a conductive line 35 in contact with the magnetic tunnel junction pattern 223. The conductive line 35 may be disposed in front of the impurity region 3 and may correspond to a bit line crossing a word line.

In a semiconductor device shown in FIG. 9, the third interlayer dielectric layer 33 may be in contact with an inclined surface of the insulation pattern 25. The magnetic tunnel junction pattern 223 may be formed to have a size (e.g., a width) smaller than a top end diameter of the second contact hole 17. The semiconductor device of FIG. 9 may operate at low power due to the relatively small size of the magnetic tunnel junction pattern 223.

Figure 10:
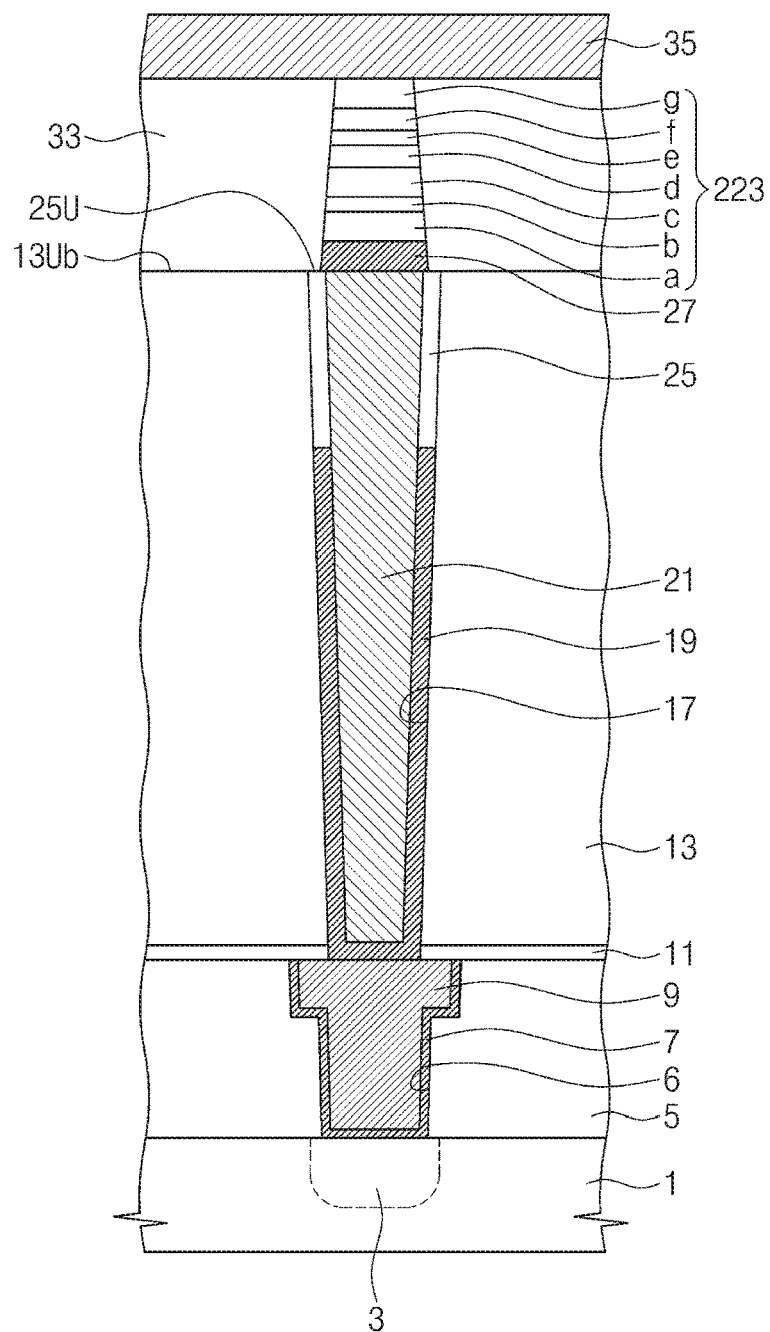
FIG. 10 is a cross-sectional view of a semiconductor device according to some example embodiments of the present inventive concepts.

FIG. 10 is a cross-sectional view of a semiconductor device according to some example embodiments of the present inventive concepts.

Referring to FIG. 10, a semiconductor device may include the second interlayer dielectric layer 13 whose top surface 13Ub is flat and coplanar or substantially coplanar with the top surface 25U of the insulation pattern 25 without the recessed region 31 on the second interlayer dielectric layer 13. Other configurations are the same or substantially the same (e.g., the same within manufacturing tolerances and/or material tolerances) as those of the semiconductor device of FIG. 9. The semiconductor device of FIG. 10 may be fabricated in such a manner that the etching process for forming the magnetic tunnel junction pattern 223 and the conductive pad 27 is ideally stopped when the top surface of the second interlayer dielectric layer 13 is exposed.

In some example embodiments, an electronic device may be fabricated such that the electronic device incorporates a semiconductor device fabricated as described herein. For example, an electronic device that includes one or more of the semiconductor devices shown in at least FIGS. 9, 10, and 16-18 may be manufactured. Such an electronic device may include one or more of a computing device (e.g., a device including at least one instance of processing circuitry (e.g., a processor) and at least one instance of memory (e.g., a storage device)).

FIG. 11, FIG. 12, FIG. 13, FIG. 14, and FIG. 15 are cross-sectional views illustrating a method of fabricating a semiconductor device according to some example embodiments of the present inventive concepts.

Figure 11:
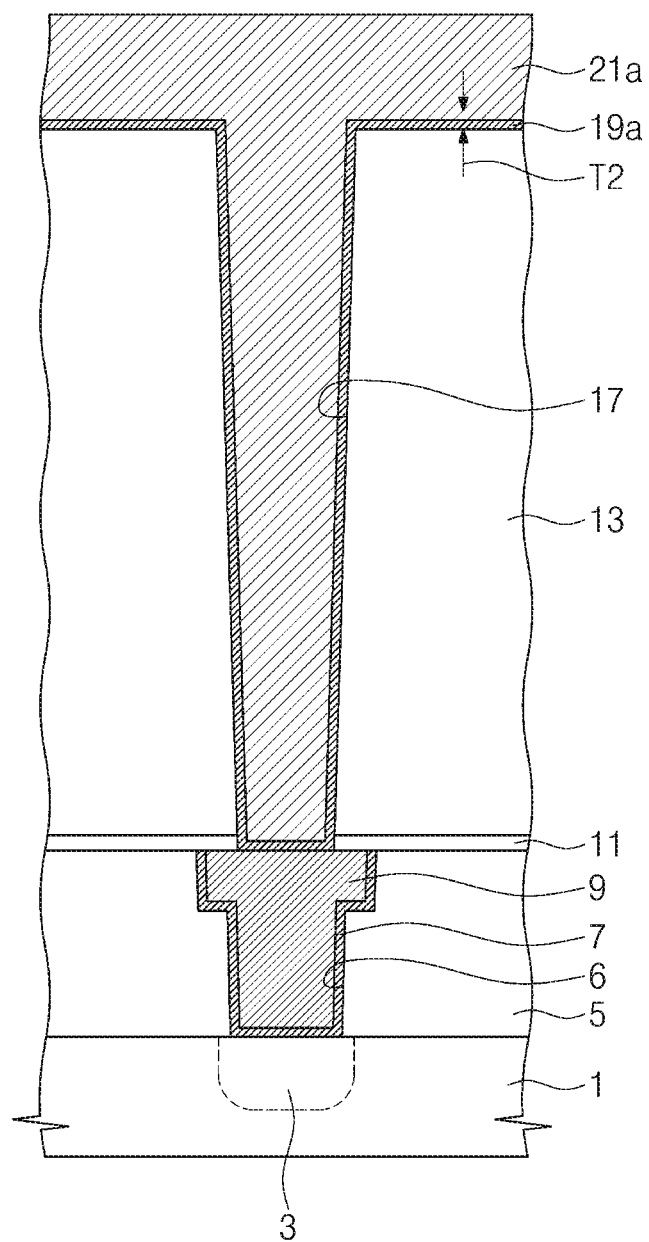
FIG. 11, FIG. 12, FIG. 13, FIG. 14, and FIG. 15 are cross-sectional views illustrating a method of fabricating a semiconductor device according to some example embodiments of the present inventive concepts.

Referring to FIG. 11, the second barrier metal layer 19a may be formed identically or similarly to that discussed with reference to FIG. 3. In some example embodiments, the second barrier metal layer 19a may be formed thinner than that shown in FIG. 3. For example, the second contact hole 17 may be formed in the second interlayer dielectric layer 13, the second barrier metal layer 19a may be conformally formed to have a second thickness T2 that is less than the thickness T1 of the second barrier metal layer 19a discussed in FIG. 3, and the second conductive layer 21a may be formed to fill the second contact hole 17.

Figure 12:
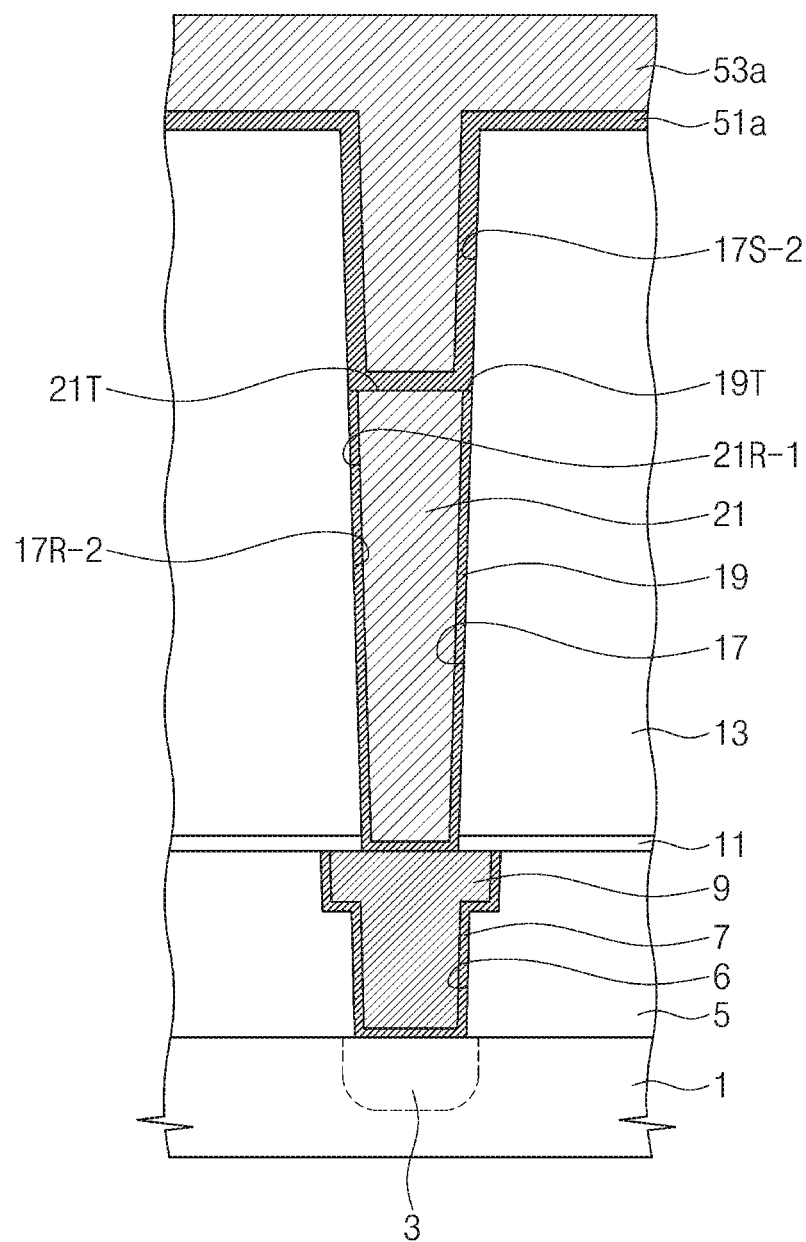

Referring to FIG. 12, an etch-back process may be performed on the second conductive layer 21a and the second barrier metal layer 19a such that the second contact hole 17 may be exposed on its upper sidewall 17S-2. Thus, the remaining second barrier metal 19 covers a lower sidewall 17R-2 (also referred to herein as simply a lower sidewall) of the second contact hole 17 and a lower sidewall 21R-1 of the second contact plug 21. Simultaneously or substantially simultaneously (e.g., simultaneously within manufacturing tolerances and/or material tolerances) with the exposure of the upper sidewall 17S-2 of the second contact hole 17, the second barrier metal 19 and the second contact plug 21 may be formed in a lower portion of the second contact hole 17. Prior to the etch-back process, a CMP process may be performed in advance on the second conductive layer 21a and the second barrier metal layer 19a. In this case, the second interlayer dielectric layer 13 may be exposed on its top surface, such as that shown in FIG. 4. A third barrier metal layer 51a may be conformally formed on an entire surface of the second interlayer dielectric layer 13. The third barrier metal layer 51a may be formed to cover an upper sidewall 17S-2 of the second contact hole 17, a top surface 19T of the second barrier metal 19, and a top surface 21T of the second contact plug 21. The third barrier metal layer 51a may be formed of a metal nitride layer such as a titanium nitride layer or a tungsten nitride layer. As shown in FIG. 12, the third barrier metal layer 51a may be formed to have a thickness greater than the thickness of the second barrier metal 19. The third barrier metal layer 51a may be provided thereon with a third conductive layer 53a filling an upper portion of the second contact hole 17. The third conductive layer 53a may be formed of a conductive material different from that of the third barrier metal layer 51a. The third conductive layer 53a may be formed of, for example, copper or tungsten.

Figure 13:
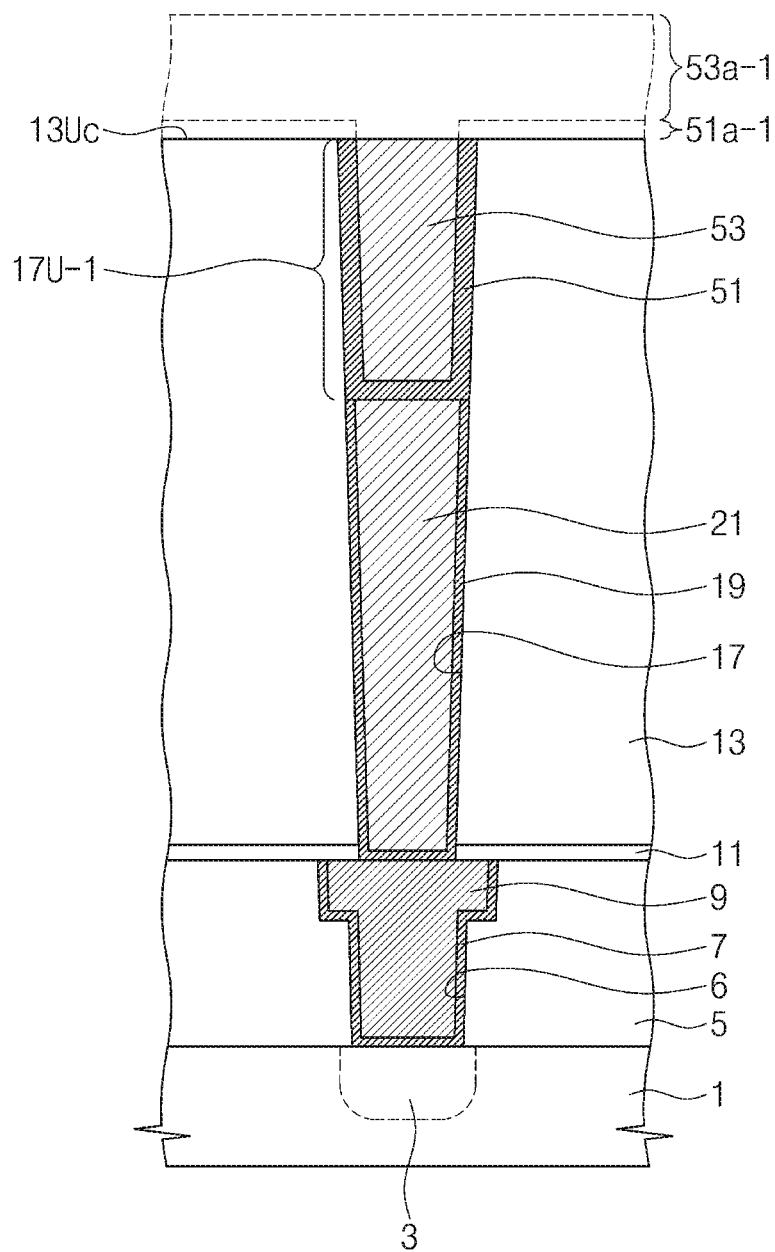

Referring to FIG. 13, a CMP or etch-back process may be performed to remove at least an upper portion 51a-1 of the third barrier metal layer 51a and at least an upper portion 53a-1 of the third conductive layer 53a on the second interlayer dielectric layer 13. In this case, the second interlayer dielectric layer 13 may be exposed on its top surface 13Uc, and simultaneously or substantially simultaneously, a third barrier metal 51 and a third contact plug 53 may be formed in the upper portion 17U-1 of the second contact hole 17.

Figure 14:
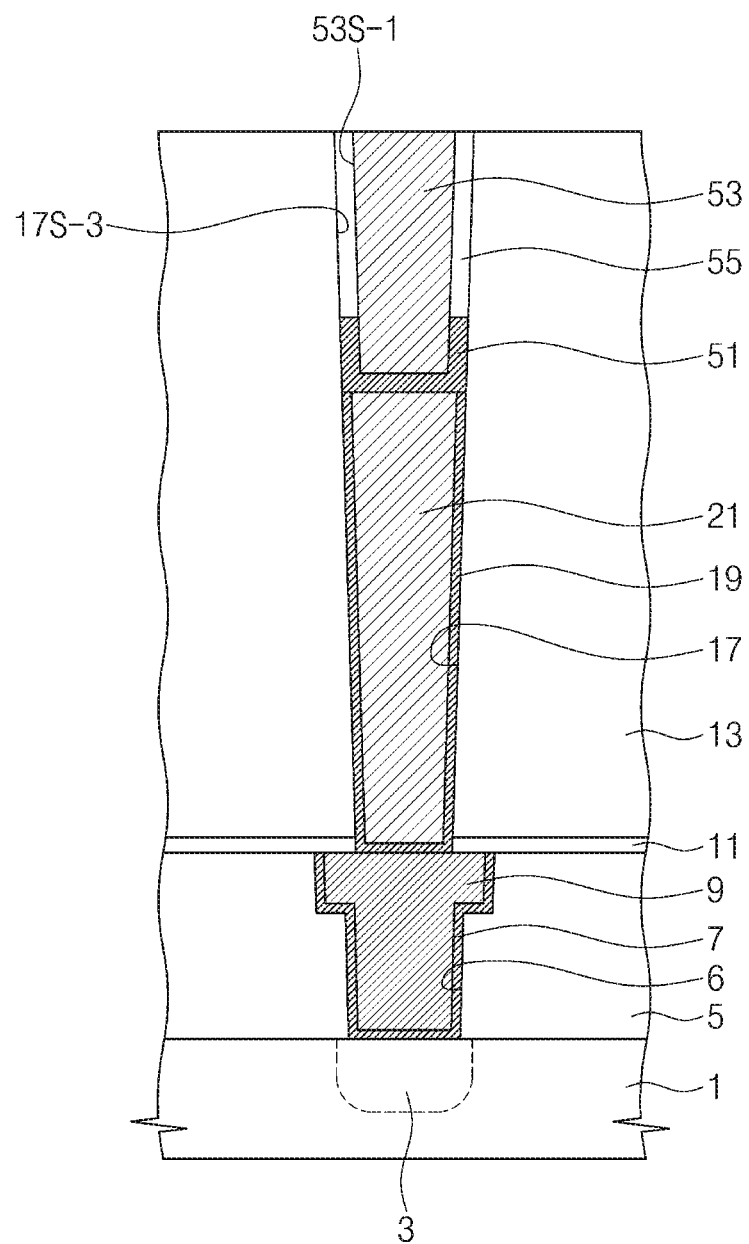

Referring to FIG. 14, a portion of the third barrier metal 51 may be selectively removed to form a ring-shaped groove exposing an upper sidewall 17S-3 of the second contact hole 17 and a sidewall 53S-1 of the third contact plug 53. The selective removal of the third barrier metal 51 may be achieved by a wet etching process using an etchant that includes, for example, sulfuric acid, peroxide, and/or inorganic ammonium. The groove may be filled with an insulation layer formed on the entire surface of the semiconductor substrate 1, and then a planarization process may be performed to remove the insulation layer on the second interlayer dielectric layer 13 and leave an insulation pattern 55 in the groove. The insulation pattern 55 may be formed of, for example, a silicon oxide layer, a silicon nitride layer, or a silicon oxynitride layer. In an upper portion of the second contact hole 17, the insulation pattern 55 may surround the sidewall of the third contact plug 53 and may be exposed on its top surface.

Figure 15:
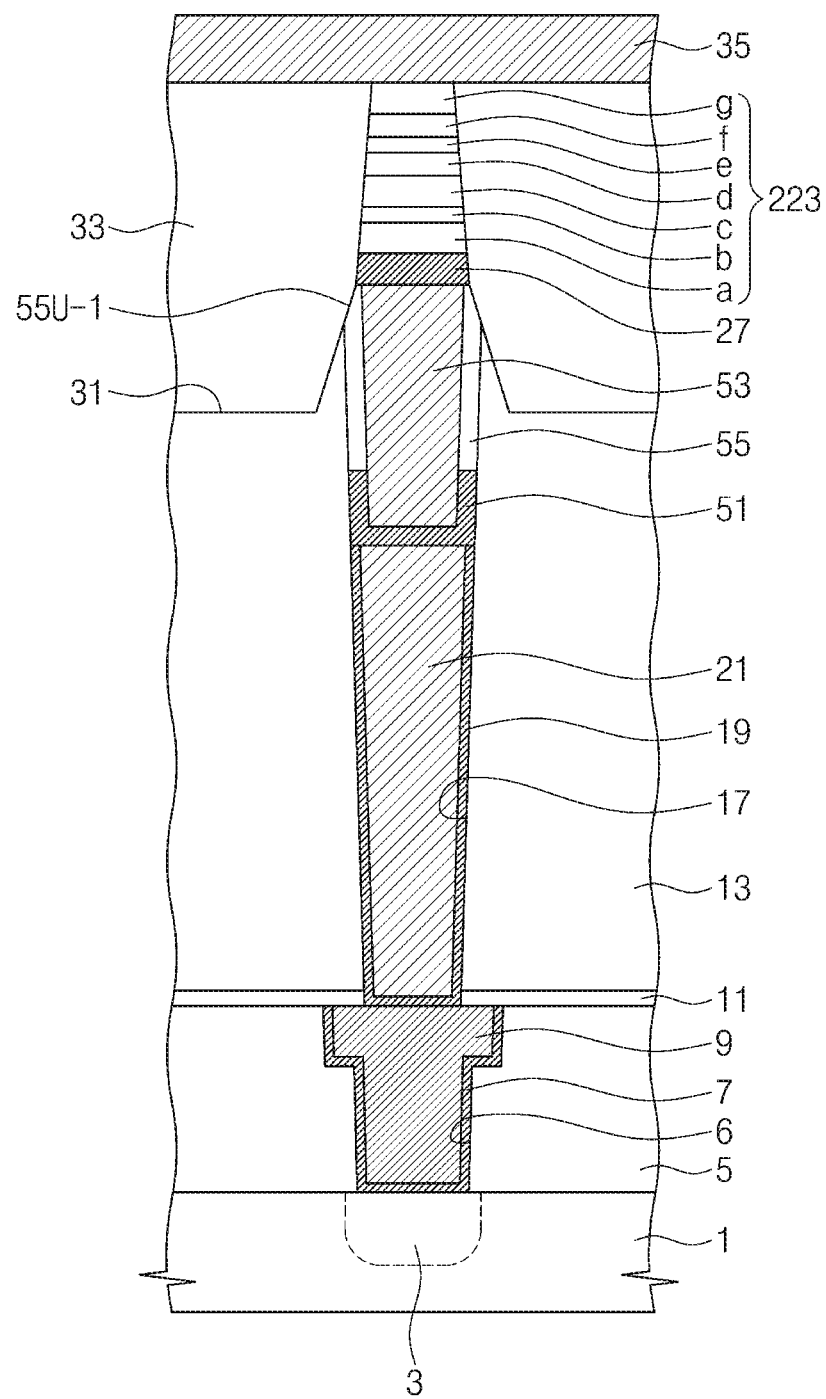

Referring to FIG. 15, a conductive pad layer and multiple layers a to g may be formed and then patterned on the entire surface of the second interlayer dielectric layer 13, and thereby the conductive pad 27 and the magnetic tunnel junction pattern 223 may be formed. The conductive pad 27 may be, for example, a titanium nitride layer having an amorphous crystal structure. In some example embodiments, the conductive pad 27 may be formed to have a crystal structure essentially included in the first magnetic layer a. During the patterning process described above, an upper portion of the second interlayer dielectric layer 13 may be over-etched to form the recessed region 31. The insulation pattern 55 may be exposed on its inclined top surface 55U-1 below the conductive pad 27. The conductive pad 27 may be formed to completely cover a top surface of the third contact plug 53. The third interlayer dielectric layer 33 may be formed on the second interlayer dielectric layer 13. The third interlayer dielectric layer 33 may be provided thereon with the conductive line 35 in contact with the magnetic tunnel junction pattern 223. Detailed kinds of the layers and processes may be identical or similar to those discussed with reference to FIGS. 1 to 9.

In a semiconductor device shown in FIG. 15, the second contact hole 17 may be provided therein with the second barrier metal 19, the second contact plug 21, the third barrier metal 51, the third contact plug 53, and the insulation pattern 55. The third barrier metal 51 may be interposed between the second contact plug 21 and the third contact plug 53.

According to a method of fabricating a semiconductor device shown in FIGS. 11 to 15, the second barrier metal 19 may be formed to have a relatively small thickness to improve filling characteristics of the second contact plug 21, as shown in FIG. 15. In addition, as the second contact hole 17 is provided therein with a barrier metal having a relatively higher electrical resistance than that of a contact plug, a signal transfer speed may be enhanced due to reduction in an overall electrical resistance of conductive layers in the second contact hole 17.

Figure 16:
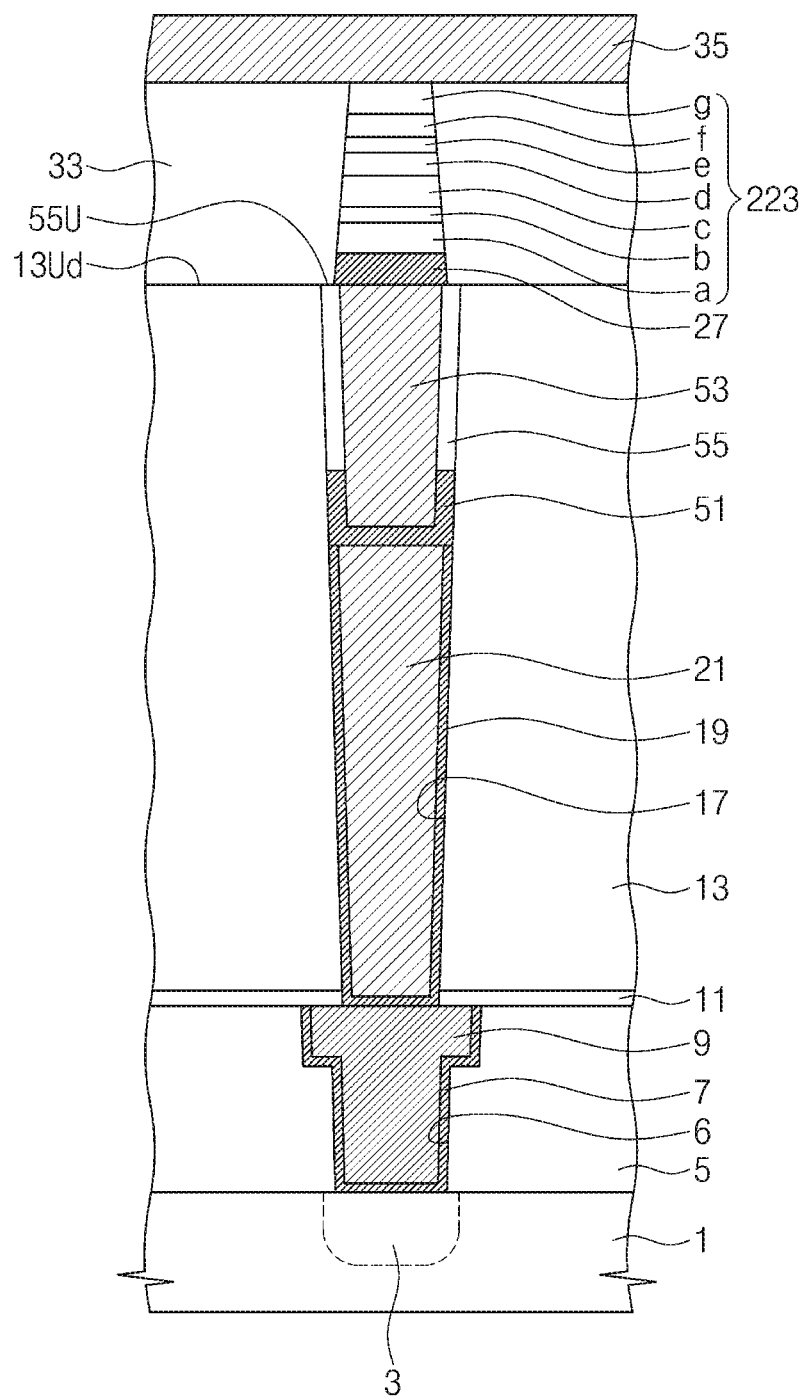
FIG. 16 is a cross-sectional view of a semiconductor device according to some example embodiments of the present inventive concepts.

FIG. 16 is a cross-sectional view of a semiconductor device according to some example embodiments of the present inventive concepts.

Referring to FIG. 16, a semiconductor device may include the second interlayer dielectric layer 13 whose top surface 13Ud is flat and coplanar or substantially coplanar with the top surface 55U of the insulation pattern 55 without the recessed region 31 on the second interlayer dielectric layer 13. Other configurations are the same or substantially the same as those of the semiconductor device of FIG. 15. The semiconductor device of FIG. 16 may be fabricated in such a manner that the etching process for forming the magnetic tunnel junction pattern 223 and the conductive pad 27 is ideally stopped when the top surface of the second interlayer dielectric layer 13 is exposed.

Figure 17:
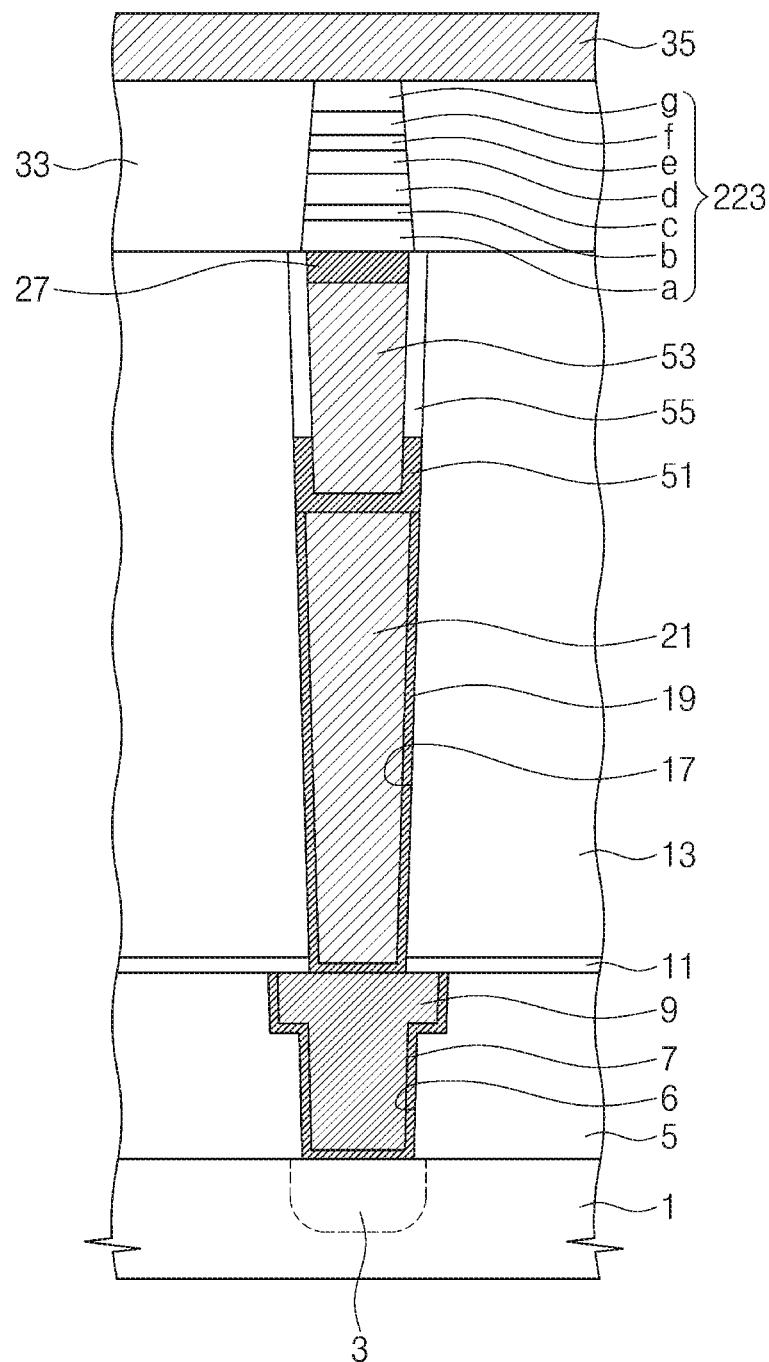
FIG. 17 is a cross-sectional view of a semiconductor device according to some example embodiments of the present inventive concepts.

FIG. 17 is a cross-sectional view of a semiconductor device according to some example embodiments of the present inventive concepts.

Referring to FIG. 17, a semiconductor device according to some example embodiments may include the conductive pad 27 disposed in an upper portion of the second contact hole 17. The conductive pad 27 may be formed by forming the insulation pattern 55 such as that shown in FIG. 15, removing a portion of the third contact plug 53, forming a conductive layer, and performing a planarization process on the conductive layer. As shown in FIG. 17, the magnetic tunnel junction pattern 223 may be formed to have a bottom surface that completely covers a top surface of the conductive pad 27, and a top surface of the insulation pattern 55 may be exposed to outside of the magnetic tunnel junction pattern 223. Restated, each edge of the bottom surface of the magnetic tunnel junction pattern 223 may at least partially overlap the insulation pattern 55. Other configurations and fabrication processes may be identical or similar to those discussed with reference to FIGS. 11 to 15.

Figure 18:
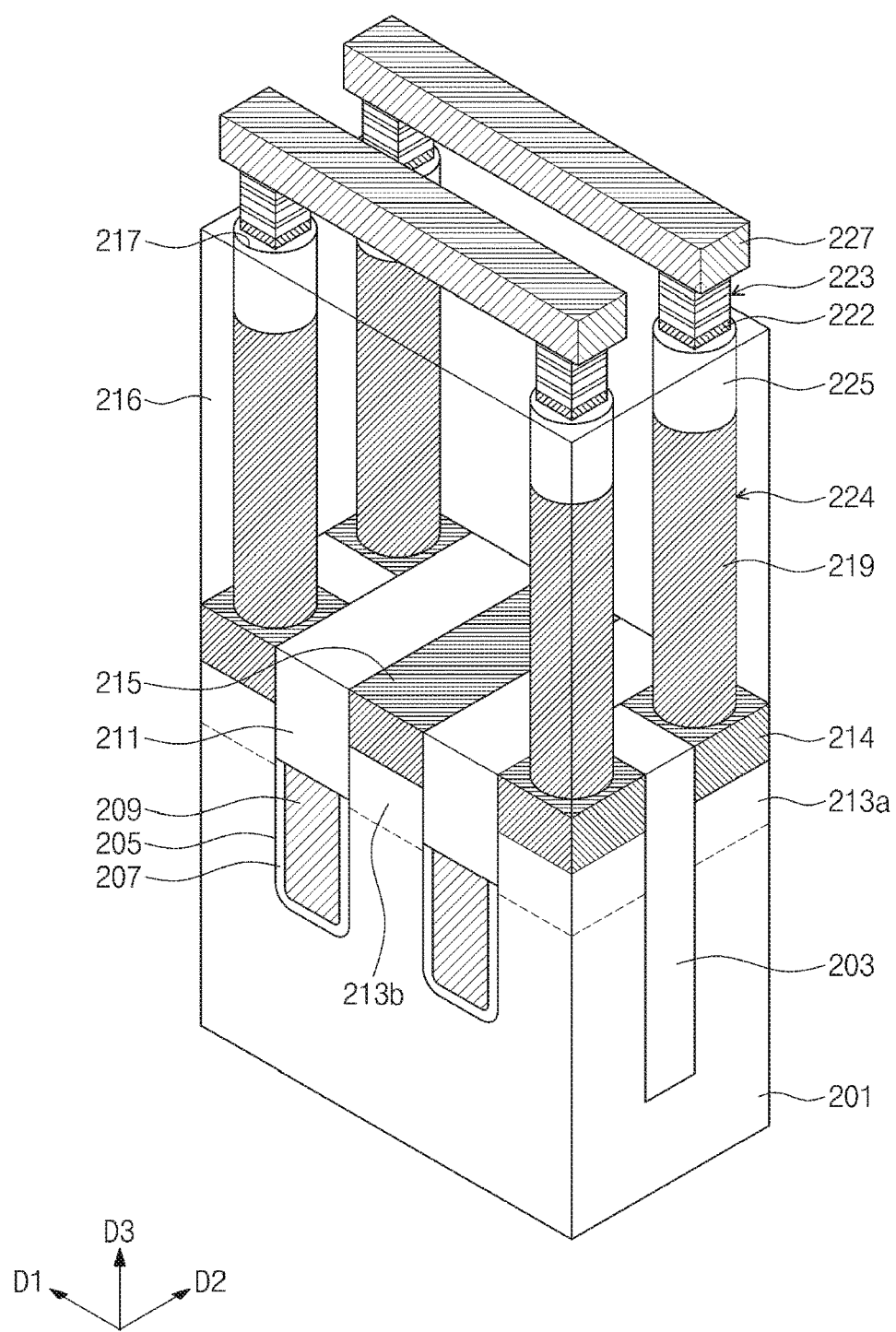
FIG. 18 is a perspective view illustrating a semiconductor device according to some example embodiments of the present inventive concepts.

FIG. 18 is a perspective view illustrating a semiconductor device according to some example embodiments of the present inventive concepts.

Referring to FIG. 18, a semiconductor substrate 201 may be provided therein with a device isolation layer 203 that has a linear shape extending in a first direction D1 and defines an active region. The semiconductor substrate 201 and the device isolation layer 203 may be partially recessed to form a plurality of trenches 205 extending in a second direction D2 in the semiconductor substrate 201. A word line 209 may be disposed in each of the trenches 205. A gate dielectric layer 207 may be interposed between the word line 209 and the semiconductor substrate 201. A capping pattern 211 may be disposed on the word line 209. The word line 209 may be formed of a conductive material. The gate dielectric layer 207 may be formed of, for example, an insulation layer such as a silicon oxide layer. The capping pattern 211 may be formed of, for example, an insulation layer such as a silicon nitride layer. First impurity regions 213a and second impurity regions 213b may be disposed in the semiconductor substrate 201 on opposite sides of the word line 209. A common source line 215 may be provided connected to the second impurity regions 213b between the word lines 209. First conductive pads 214 may be disposed on corresponding first impurity regions 213a spaced apart from the common source line 215. The common source line 215 and the first conductive pads 214 may be formed of, for example, metal silicide. Top surfaces of the first conductive pad 214, the common source line 215, and the capping pattern 211 may be coplanar or substantially coplanar with each other.

An interlayer dielectric layer 216 may be disposed on the first conductive pads 214, the common source line 215, and the capping patterns 211. The interlayer dielectric layer 216 may be provided therein with a contact structure 224 having a cross-section, for example, such as that shown in FIG. 10. For example, the contact structure 224 may include a barrier metal 219 partially covering a floor surface and a sidewall of a contact hole 217, a contact plug disposed in the contact hole 217, and an insulation pattern 225 interposed between the contact plug and a sidewall of the contact hole 217 while the insulation pattern 225 is being disposed in an upper portion of the contact hole 217.

The contact structure 224 may have a cross-section such as that shown in FIG. 10, or alternatively may have a structure such as that shown in FIG. 9, 15, 16, or 17. If the contact structure 224 has a structure such as that shown in FIG. 17, the contact hole 217 may have therein a second conductive pad 222 which will be discussed below.

The contact structure 224 may be provided thereon with a second conductive pad 222 and a magnetic tunnel junction pattern 223. The second conductive pad 222 may be formed of an amorphous conductive layer. The insulation pattern 225 may have a top surface exposed to outside of the second conductive pad 222. The second conductive pad 222 may completely cover a top surface of the contact plug. The magnetic tunnel junction pattern 223 may be connected to a bit line 227 extending in the first direction D1 crossing an extending direction of the word line 209.

In a method of fabricating a semiconductor device according to some example embodiments of the present inventive concepts, a barrier metal may be partially replaced with an insulation layer. The insulation layer may be exposed instead of a conductive layer when an etching process is performed to form a magnetic tunnel junction pattern, so that, even if the insulation layer is re-deposited on a sidewall of the magnetic tunnel junction pattern, the re-deposited insulation layer may mitigate and/or prevent an electrical short between layers constituting the magnetic tunnel junction pattern.

In a semiconductor device according to some example embodiments of the present inventive concepts, the magnetic tunnel junction pattern may be formed to have a size smaller less than a top end diameter of a contact hole. The semiconductor device may thus be operated at low power due to the small size of the magnetic tunnel junction pattern.

Although the present inventive concepts have been described in connection with some example embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the inventive concepts.

What is claimed is:

1. A device, comprising:
   a first interlayer dielectric layer on a semiconductor substrate, the first interlayer dielectric layer including a contact hole;
   a contact plug in the contact hole, the contact plug having a bottom surface, a lower sidewall, and an upper sidewall;
   a first barrier metal in the contact hole, the first barrier metal covering the bottom surface of the contact plug and the lower sidewall of the contact plug, the first barrier metal exposing the upper sidewall of the contact plug;
   an insulation pattern in the contact hole, the insulation pattern covering the upper sidewall of the contact plug; and
   a magnetic tunnel junction pattern covering a top surface of the contact plug,
   wherein the insulation pattern is exposed below the magnetic tunnel junction pattern and a top surface of the insulation pattern is exposed from the contact plug,
   wherein a width of a bottom surface of the magnetic tunnel junction pattern is greater than a width of the top surface of the contact plug such that at least a portion of the bottom surface of the magnetic tunnel junction pattern vertically overlaps at least a portion of the top surface of the insulation pattern.

2. The device of claim 1, further comprising:
   a second interlayer dielectric layer on the first interlayer dielectric layer, the second interlayer dielectric layer covering a side surface of the magnetic tunnel junction pattern, wherein the second interlayer dielectric layer is in contact with the insulation pattern.

3. The device of claim 1, wherein,
the first interlayer dielectric layer includes a top surface, the top surface of the first interlayer dielectric layer including a recessed region adjacent to the contact hole, and
the top surface of the insulation pattern is exposed on an edge of a sidewall of the recessed region.

4. The device of claim 1, wherein,
the first interlayer dielectric layer includes a top surface, and
the top surface of the first interlayer dielectric layer is substantially coplanar with the top surface of the insulation pattern.

5. The device of claim 1, wherein,
the contact plug includes a first contact plug and a second contact plug, the first contact plug is in contact with the first barrier metal, and an upper sidewall of the second contact plug is in contact with the insulation pattern, and
the device further includes a second barrier metal that is interposed between the first contact plug and the second contact plug and between the first interlayer dielectric layer and a lower sidewall of the second contact plug.

6. The device of claim 5, wherein the second barrier metal is thicker than the first barrier metal.

7. The device of claim 5, wherein the insulation pattern has a substantially same thickness as a thickness of the second barrier metal.

8. The device of claim 1, further comprising:
an amorphous conductive pad between the magnetic tunnel junction pattern and the contact plug,
wherein the amorphous conductive pad covers an entire top surface of the contact plug and is in contact with at least a portion of the top surface of the insulation pattern.

9. The device of claim 1, wherein
an edge of the bottom surface of the magnetic tunnel junction pattern overlaps the insulation pattern.

10. A device, comprising:
a first interlayer dielectric layer including a contact hole;
a contact plug in the contact hole, the contact plug having a bottom surface, a lower sidewall, and an upper sidewall;
a first barrier metal in the contact hole, the first barrier metal covering the bottom surface of the contact plug and the lower sidewall of the contact plug, the first barrier metal exposing the upper sidewall of the contact plug; and
an insulation pattern in the contact hole, the insulation pattern covering the upper sidewall of the contact plug, the insulation pattern isolating the first barrier metal from exposure; and
a magnetic tunnel junction pattern covering a top surface of the contact plug,
wherein the first interlayer dielectric layer includes a top surface, the top surface of the first interlayer dielectric layer including a recessed region adjacent to the contact hole, and
wherein the insulation pattern includes a top surface, the top surface of the insulation pattern exposed on an edge of a sidewall of the recessed region wherein a width of a bottom surface of the magnetic tunnel junction pattern is greater than a width of the top surface of the contact plug such that at least a portion of the bottom surface of the magnetic tunnel junction pattern vertically overlaps at least a portion of the top surface of the insulation pattern.

11. The device of claim 10, wherein,
the first interlayer dielectric layer includes a top surface, and
the top surface of the first interlayer dielectric layer is substantially coplanar with the top surface of the insulation pattern.

12. The device of claim 10, wherein,
the contact plug includes a first contact plug and a second contact plug, the first contact plug is in contact with the first barrier metal, and an upper sidewall of the second contact plug is in contact with the insulation pattern, and
the device further includes a second barrier metal that is interposed between the first contact plug and the second contact plug and between the first interlayer dielectric layer and a lower sidewall of the second contact plug.

13. A device, comprising:
a contact plug, the contact plug having a bottom surface, a lower sidewall, and an upper sidewall;
a first barrier metal covering the bottom surface of the contact plug and the lower sidewall of the contact plug, the first barrier metal exposing the upper sidewall of the contact plug;
an insulation pattern covering the upper sidewall of the contact plug; and
an amorphous conductive pad directly on the contact plug and the insulation pattern,
wherein the amorphous conductive pad is in direct contact with and covers an entire top surface of the contact plug and is in direct contact with at least a portion of a top surface of the insulation pattern.

14. The device of claim 13, wherein,
the contact plug includes a first contact plug and a second contact plug, the first contact plug is in contact with the first barrier metal, and an upper sidewall of the second contact plug is in contact with the insulation pattern, and
the device further includes a second barrier metal that is interposed between the first contact plug and the second contact plug and between a first interlayer dielectric layer and a lower sidewall of the second contact plug.

15. The device of claim 13, further comprising:
a magnetic tunnel junction pattern covering a top surface of the amorphous conductive pad.

16. The device of claim 13, wherein,
all of the contact plug, the first barrier metal, and the insulation pattern are in a contact hole of a first interlayer dielectric layer.

17. The device of claim 13, wherein the insulation pattern has a substantially same thickness as a thickness of the first barrier metal.

18. The device of claim 10, further comprising:
an amorphous conductive pad between the magnetic tunnel junction pattern and the contact plug,
wherein the amorphous conductive pad covers an entire top surface of the contact plug and is in contact with at least a portion of a top surface of the insulation pattern.

* * * * *